United States Patent
Joram et al.

(10) Patent No.: US 11,853,141 B2
(45) Date of Patent: Dec. 26, 2023

(54) POWER FOR ELECTRIC REQUIREMENT SYSTEMS TO EVALUATE UTILITY AND SUPPLY

(71) Applicants: Michael P. Joram, Fredericksburg, VA (US); Emily E. Rabin, King George, VA (US); Bridgett M. Burg, Fredericksburg, VA (US); Kyle S. Dalton, Fredericksburg, VA (US); Steven H. Lohrey, Fredericksburg, VA (US); Dominique K. James, Fredericksburg, VA (US); Tyler M. Boitnott, Fredericksburg, VA (US)

(72) Inventors: Michael P. Joram, Fredericksburg, VA (US); Emily E. Rabin, King George, VA (US); Bridgett M. Burg, Fredericksburg, VA (US); Kyle S. Dalton, Fredericksburg, VA (US); Steven H. Lohrey, Fredericksburg, VA (US); Dominique K. James, Fredericksburg, VA (US); Tyler M. Boitnott, Fredericksburg, VA (US)

(73) Assignee: United States of America, as represented by the Secretary of the Navy, Arlington, VA (US)

( * ) Notice: Subject to any disclaimer, the term of this patent is extended or adjusted under 35 U.S.C. 154(b) by 0 days.

(21) Appl. No.: 17/709,484

(22) Filed: Mar. 31, 2022

(65) Prior Publication Data

US 2023/0315180 A1    Oct. 5, 2023

(51) Int. Cl.
| | | |
|---|---|---|
| G06F 1/3206 | (2019.01) | |
| G05B 15/02 | (2006.01) | |
| G01R 22/06 | (2006.01) | |
| G01R 21/06 | (2006.01) | |
| H03K 19/17728 | (2020.01) | |

(52) U.S. Cl.
CPC ........... G06F 1/3206 (2013.01); G01R 21/06 (2013.01); G01R 22/061 (2013.01); G05B 15/02 (2013.01); H03K 19/17728 (2013.01)

(58) Field of Classification Search
CPC ..... G06F 1/3206; G01R 21/06; G01R 22/061; G05B 15/02; H03K 19/17728
See application file for complete search history.

(56) References Cited

U.S. PATENT DOCUMENTS

| | | | |
|---|---|---|---|
| 2009/0312968 A1* | 12/2009 | Phillips | G01R 22/063 702/62 |
| 2010/0167659 A1* | 7/2010 | Wagner | G08C 19/02 455/343.1 |

* cited by examiner

*Primary Examiner* — Gary Collins
(74) *Attorney, Agent, or Firm* — Gerhard W. Thielman (57) ABSTRACT

A computer implemented method is provided for monitoring and managing system electrical power usage. The method includes sensing component electrical usage, comparing the component usage against a corresponding lookup table, and adjusting the component usage so system power usage remains below an established threshold.

5 Claims, 10 Drawing Sheets

CS-Combat System
HM&E-Hull, Mechanical, and Electrical

| Time | Off | Fire (W) | Slow Track (W) | Medium Track (W) | Fast Track (W) |
|---|---|---|---|---|---|
| 1 | 0 | 3092.407 | 8115.711771 | 38483.37633 | 40581.65568 |
| 2 | 0 | 11762.31 | 30896.00496 | 38435.52652 | 40531.1969 |
| 3 | 0 | 12823.74 | 33654.62341 | 38465.58781 | 40562.89726 |
| 4 | 0 | 13113.53 | 34415.15727 | 38521.18625 | 40621.52716 |
| 5 | 0 | 13155.66 | 34525.69949 | 38444.59151 | 40540.75615 |
| 6 | 0 | 13191.19 | 34618.96017 | 38499.92637 | 40599.1081 |
| 7 | 0 | 13191.17 | 34618.91033 | 38486.1984 | 40584.63162 |
| 8 | 0 | 13188.09 | 34610.81112 | 38473.73615 | 40571.48988 |
| 9 | 0 | 13195.93 | 34631.49354 | 38495.35889 | 40594.29158 |
| 10 | 0 | 13191.73 | 34620.37607 | 38481.8194 | 40580.01386 |

POWER FOR ELECTRIC REQUIREMENT SYSTEMS TO EVALUATE UTILITY AND SUPPLY

STATEMENT OF GOVERNMENT INTEREST

The invention described was made in the performance of official duties by one or more employees of the Department of the Navy, and thus, the invention herein may be manufactured, used or licensed by or for the Government of the United States of America for governmental purposes without the payment of any royalties thereon or therefor.

BACKGROUND

The invention relates generally to electrical power monitoring and distribution. In particular, the invention relates to shipboard utility power regulation, including release and storage.

Naval Surface Warfare Center-Dahlgren Division (NSWCDD) embarked on a project called Sustained Power Loading for Integrated Combat Energy (SPLICE) to demonstrate simulated, real-time information transfer between a ship's Machine Control System (MCS) and its Combat System (CS). The Platform Independent Naval Combat Electric poweR (PINCER) project by NSWC-Philadelphia Division (NSWCPD) provides a detailed model of the MCS and CS controls for generation sources and loads. NSWCDD Sly Fox teams operate to address particular technical issues that affect naval operations, which includes power supply management.

There is no standing conventional technique for the merged observation of both the Weapon Systems and Hull, Mechanical, and Electrical (HM&E) Systems of a ship. A holistic method exists to monitor the HM&E systems alone. However, this existing method gathers "big-picture" data for monitoring generator and electrical bus health, but is not designed to observe the power consumed by individual weapon systems.

Historically, a ship's Weapons System and HM&E systems have not communicated due to a cross-domain issue where HM&E is unclassified and weapon systems are classified. The HM&E systems are currently monitored through the MCS on many ships via sensors installed throughout the ship's power plant.

SUMMARY

Conventional electrical power monitoring techniques yield disadvantages addressed by various exemplary embodiments of the present invention. In particular, various exemplary embodiments provide a computer implemented method for monitoring and managing system electrical power usage. The method includes sensing component electrical usage, comparing the component usage against a corresponding lookup table, and adjusting the component usage so system power usage remains below an established threshold.

BRIEF DESCRIPTION OF THE DRAWINGS

These and various other features and aspects of various exemplary embodiments will be readily understood with reference to the following detailed description taken in conjunction with the accompanying drawings, in which like or similar numbers are used throughout, and in which.

DETAILED DESCRIPTION

In the following detailed description of exemplary embodiments of the invention, reference is made to the accompanying drawings that form a part hereof, and in which is shown by way of illustration specific exemplary embodiments in which the invention may be practiced. These embodiments are described in sufficient detail to enable those skilled in the art to practice the invention. Other embodiments may be utilized, and logical, mechanical, and other changes may be made without departing from the spirit or scope of the present invention. The following detailed description is, therefore, not to be taken in a limiting sense, and the scope of the present invention is defined only by the appended claims.

In accordance with a presently preferred embodiment of the present invention, the components, process steps, and/or data structures may be implemented using various types of operating systems, computing platforms, computer programs, and/or general purpose machines. In addition, artisans of ordinary skill will readily recognize that devices of a less general purpose nature, such as hardwired devices, may also be used without departing from the scope and spirit of the inventive concepts disclosed herewith. General purpose machines include devices that execute instruction code. A hardwired device may constitute an application specific integrated circuit (ASIC), a field programmable gate array (FPGA), digital signal processor (DSP) or other related component.

The disclosure generally employs quantity units with the following abbreviations: time in seconds (s), electric potential in volts (V), electric current in amperes (A) and power in watts (W). Supplemental measures can be derived from these, such as energy in joules (J or Ws) and the like.

NSWCDD establishes teams of junior scientists and engineers under the Sly Fox Workforce Development Program to address specific technical concerns. Sly Fox Mission (SFM) 25 developed a power and energy generation simulation system as a high fidelity, platform-agnostic computer model for analyzing power needs of any given configuration called Power and Energy GenerAtion SimUlation System (PEGASUS) under Navy Case 111754.

Sly Fox Mission (SFM) 26 addresses power monitoring and its tactical distribution under Navy Case 112237 called Power for Electric Requirement Systems to Evaluate Utility and Supply (PERSEUS). The Zumwalt-class destroyer DDG-1000 provided the initial groundwork and investment for integrating ship service power with electric propulsion. PERSEUS is the most recent effort in a line of projects solving the integration of high-powered electric weapon systems and electric propulsion systems.

PERSEUS as SFM 26 originated as a continuation of the efforts begun with PEGASUS as SFM 25. The PERSEUS effort had two-fold goals. The first objective was to continue the effort of shipboard integration of electric weapon systems by improving the fidelity of the PEGASUS simulation modules. The second objective was to design, implement, and demonstrate all functional interfaces (e.g., physical, including electrical and mechanical) defined by PEGASUS in an integrated prototype.

The SFM 26 team's project objective served as the basis for defining the following mission needs statement: Prototype a tactical decision aid using the PEGASUS model to provide situational awareness of current and projected power states while exploring cloud-based options. Although the project by design restricts operation to only monitoring, the inclusion of feedback control expands this capability for automated power management.

Exemplary embodiments of an automated computer operated method provide for monitoring and managing electrical power of components under system constraints. This method senses power usage for a component in an operational state, compares this usage to a lookup table, and adjusts that power usage to maintain total usage below an established threshold.

PERSEUS executes three primary tasks: monitoring, projecting and prioritizing electrical consumption. Exemplary embodiments expand this diagnostic capability to power management. As an operational automated maintenance program, PERSEUS monitors electrical consumption of both Hull, Mechanical, and Electrical (HM&E) systems and weapon systems, and displays the information in a user-readable format.

PERSEUS monitors the electrical consumption through electric current (or voltage) sensors connected via Ethernet cables to a power meter. Empirical investigations for individual electrical components were measured via a portable power meter, such as the Fluke 337 instrument by Fluke Corporation in Everett, Washington and subsidiary of Fortive. The Fluke 337 clamps around a wire to measure electric current. This power meter receives the recorded values from sensor channels and relays them to a web page scraped by PERSEUS.

Then, PERSEUS parses the web page to gather the electrical current values and then stores them in an SQL database for use throughout the monitoring application. These electrical current values are pulled every second but can easily be altered to a higher frequency. Multiplying the current value by 120 V provides the estimated power throughout PERSEUS.

Figure 1:
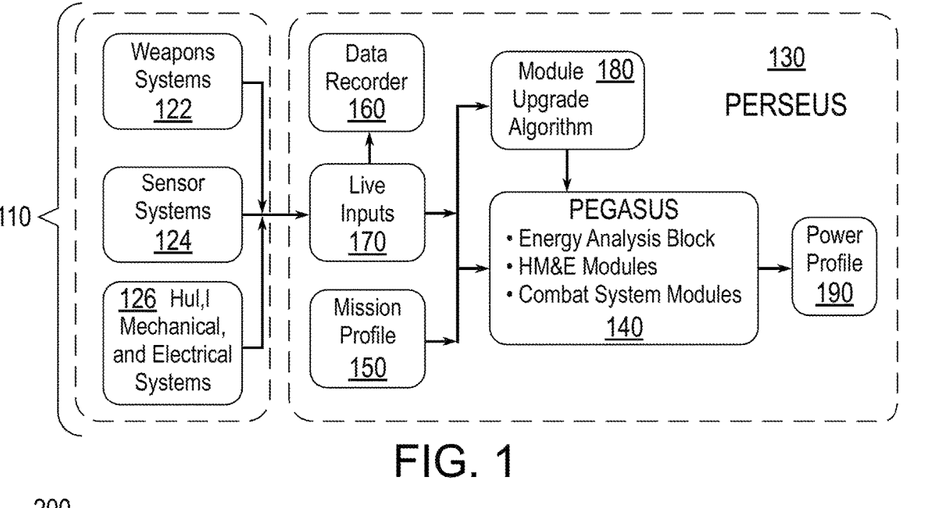
FIG. 1 is a schematic view of a PERSEUS system.

FIG. 1 shows a schematic view 100 of a monitoring system 110. This includes a legacy collection of existing hardware 120 having weapons 122, sensors 124 and HM&E systems 126. PERSEUS 130 includes PEGASUS 140 with various modules, mission profile 150, data recorder 160, live receiver inputs 170, module update algorithm 180 and power profile 190. The hardware 120 combines information from its systems to the receiver input 170, which are sent to the recorder 160. Both the input 170 and mission profile 150 provide information to the algorithm 180 and PEGASUS 140, which then updates the power profile 190. The mission profile 150 can provide a schedule for operation of the hardware 120 that draws electrical power.

Figure 2:
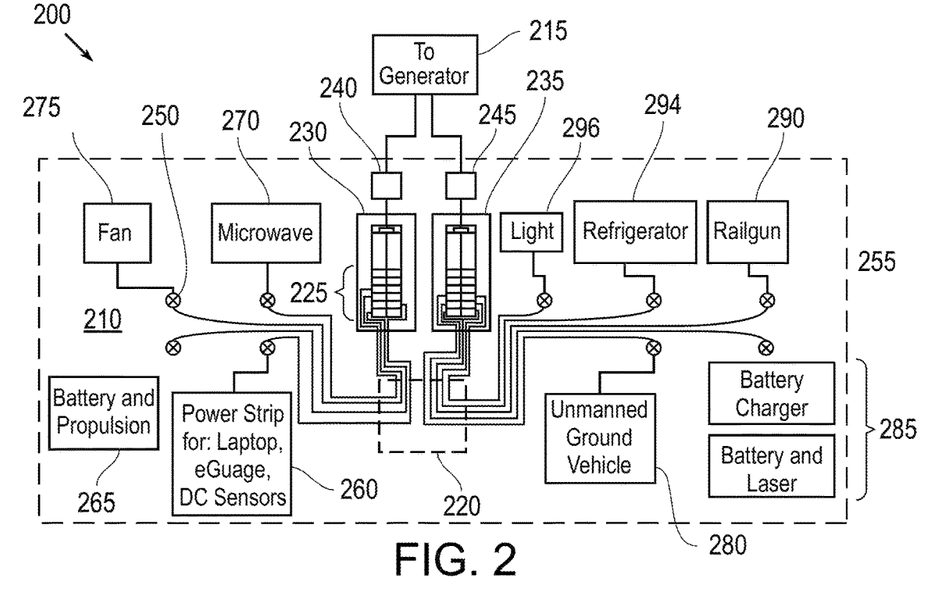
FIG. 2 is a schematic view of an electric panel distribution system.

FIG. 2 shows a schematic view 200 of an electrical system 210 in conjunction with a generic power generator 215 as a demonstration. A sensor junction box 220 connects a circuit breaker 225 at the reception end and to various components at the distribution end. First and second electric panels 230 and 235, each with circuit breakers 225, respectively connect to inlet boxes 240 and 245 that connect to the generator 215 and to respective electrical outlets 250 and 255. The first panel 230 connects via the first outlet 250 to a power strip 260, battery and propulsion 265, microwave 270 and fan 275. The second panel 235 connects via the second outlet 255 to an unmanned ground vehicle 280, charger and laser 285, railgun 290, refrigerator 294 and light 296.

Figure 3:
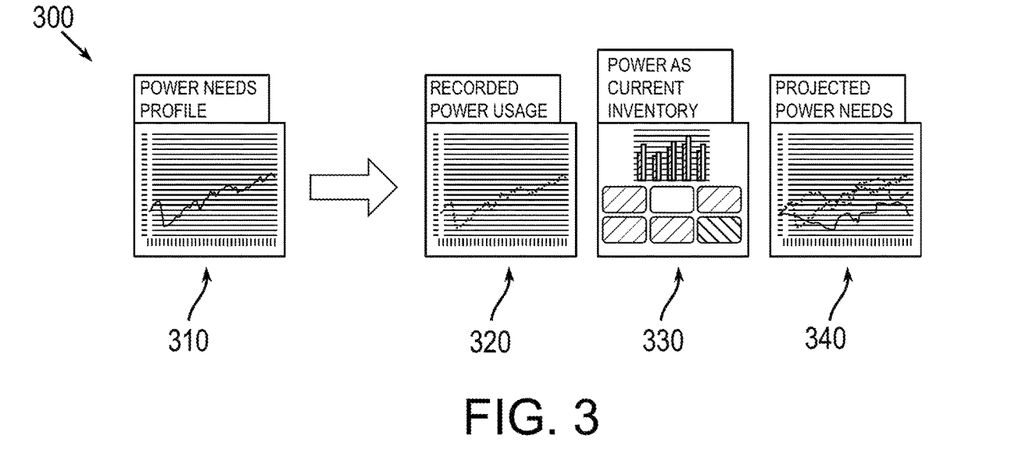
FIG. 3 is a diagram view of power projection charts.

FIG. 3 shows a schematic view 300 of visual graphs for displaying power usage. Based on tabular information, a power needs profile 310 can be generated. This can be used to augment recorded power usage 320 from empirical measurements, available inventory of power 330 to update projected power needs 340 of various electrical components, such as in view 200.

Figure 4:
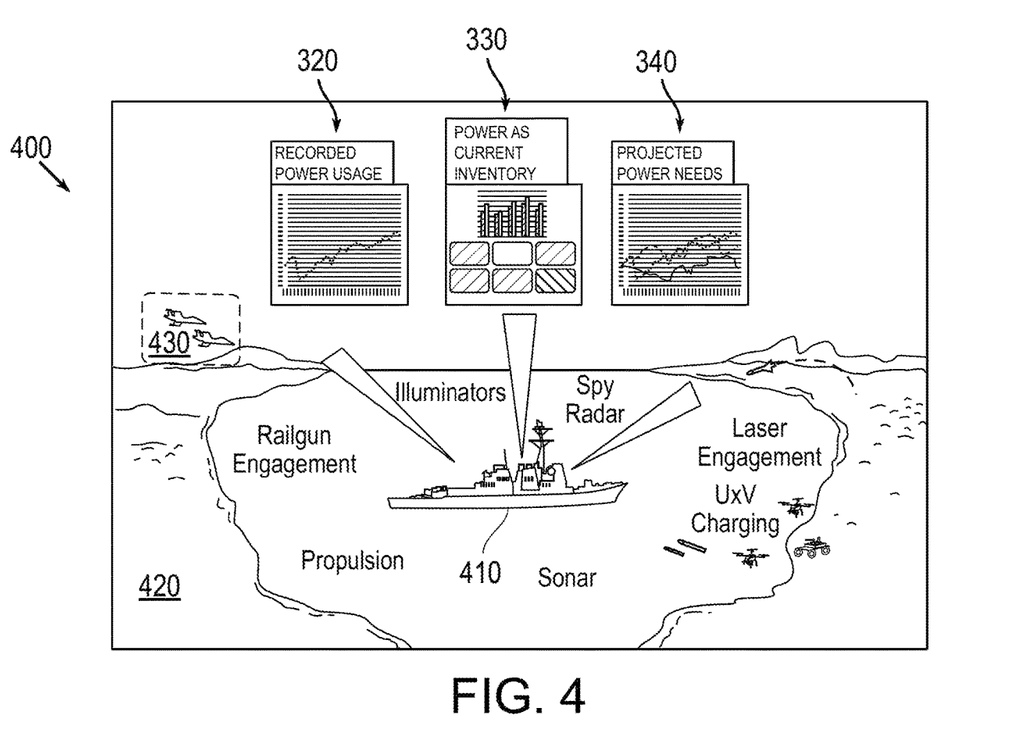
FIG. 4 is a representational view of an operational scenario.

FIG. 4 shows a representational view 400 of a combat vessel 410 in an operational environment as in a bay surrounded by land 420, with aerial bogies 430 in range. The ship 410 includes various detection equipment, such as illuminators, SPY radar, sonar and laser, as well as other necessary equipment, such as railgun, propulsion and battery charging. Power requirements can be monitored by various example graphs 320, 330 and 340.

Figure 5:
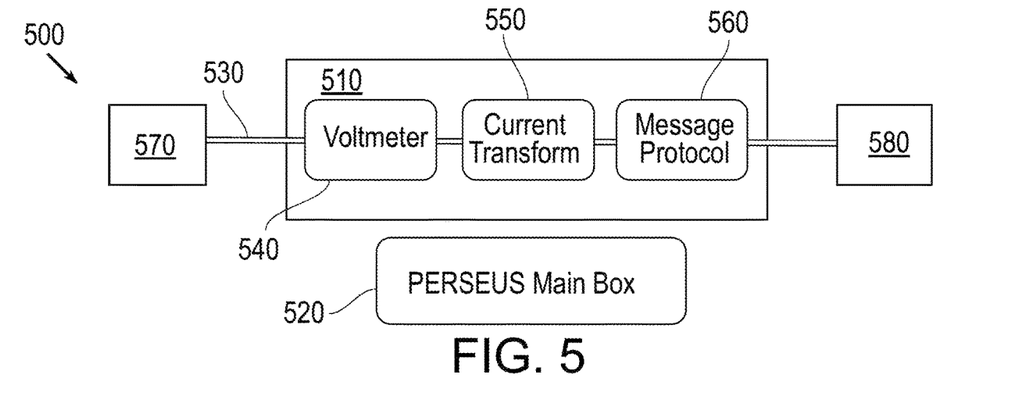
FIG. 5 is a schematic view of PERSEUS external hardware.

FIG. 5 shows a schematic view 500 of PERSEUS external hardware (PEH) 510 for an electrical component. A PERSEUS Main Box 520 receives information from the PEH 510 that connects to an electrical bus 530 to monitor power. The PEH 510 incorporates a voltmeter 540, a current transformer 550 and a message protocol 560 to present that monitoring information for the Main Box 520. The bus 530 connects the Main Box 520 to an electrical switchboard 570 and to an element 580 of the combat system.

Figure 6:
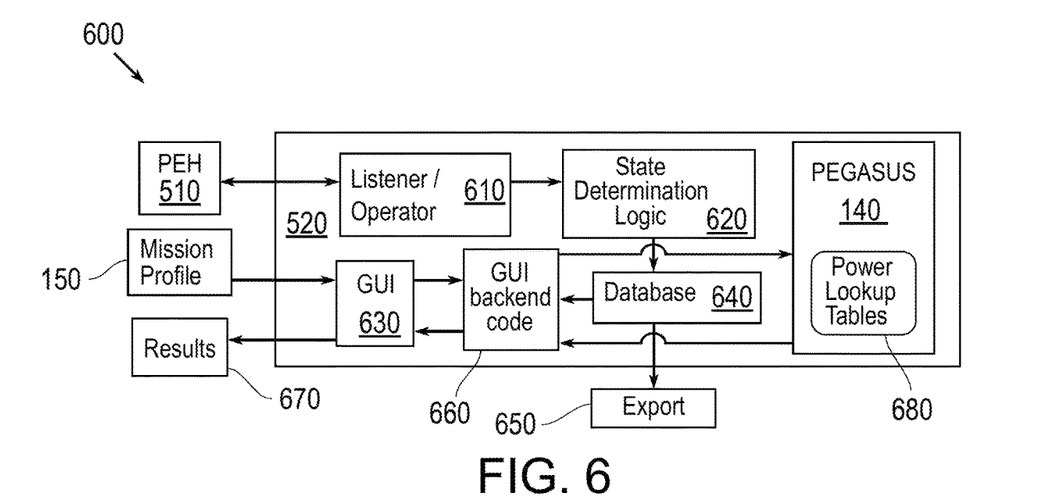
FIG. 6 is a schematic view of a PERSEUS Main Box.

FIG. 6 shows a schematic view 600 of PERSEUS 130 as the Main Box 520. The PEH 510 provides interactive information to a listener or operator 610/710 (or an automated receiver), which supplies the information to State Determination Logic 620 for analysis. Meantime, a GUI 630 receives a mission profile 150. The Logic 620 provides its information to a Database 640, which forwards them for Export 650 (external to the Main Box 520) as well as to a GUI backend code 660. The GUI 630 forwards mission information to the GUI backend code 660 and forwards the logic information therefrom to Results 670 for external display. PEGASUS 140 searches power usage via Power Lookup Tables 680 and communicates interactively with the GUI backend code 660. Under feedback autonomy, the Results 670 could be used for power control.

The SFM 26 team also derived a variety of other concepts and their comparative advantages and disadvantages. Alternatives include Network Connection Concepts identified in FIGS. 7 through 11.

Figure 7:
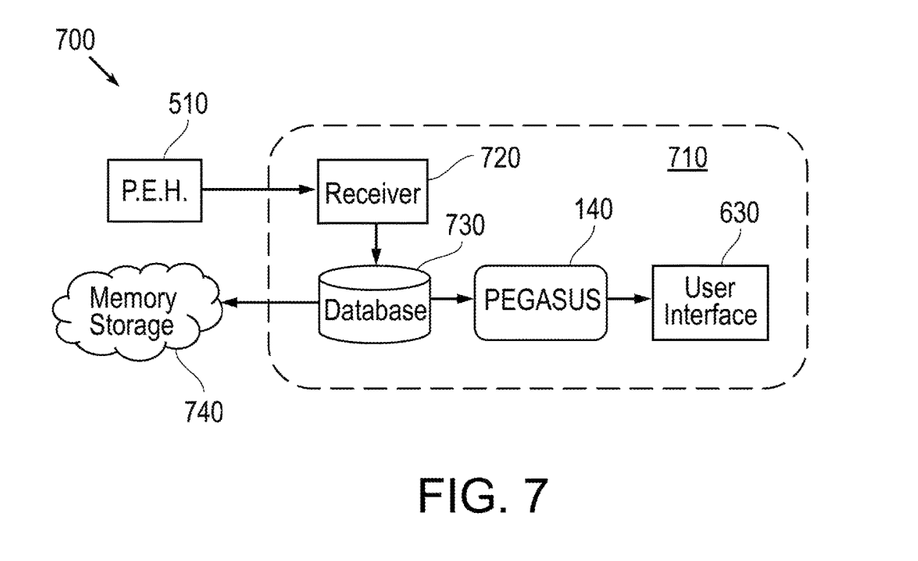
FIG. 7 is a schematic view of a monitoring system.

FIG. 7 shows a schematic view 700 of a monitoring system. A PERSEUS 130 monitoring apparatus 710 connected to PERSEUS external hardware (PEH) 510 includes a receiver 720, a database 730 that records to remote cloud storage 740 and delivers the information from PEH 510 to PEGASUS 140 for display by the graphical user interface (GUI) 630 or other related human readable system interface. Thus the power usage data measured from the PEH 510 can be directly accessed by an operator 610.

Figure 8:
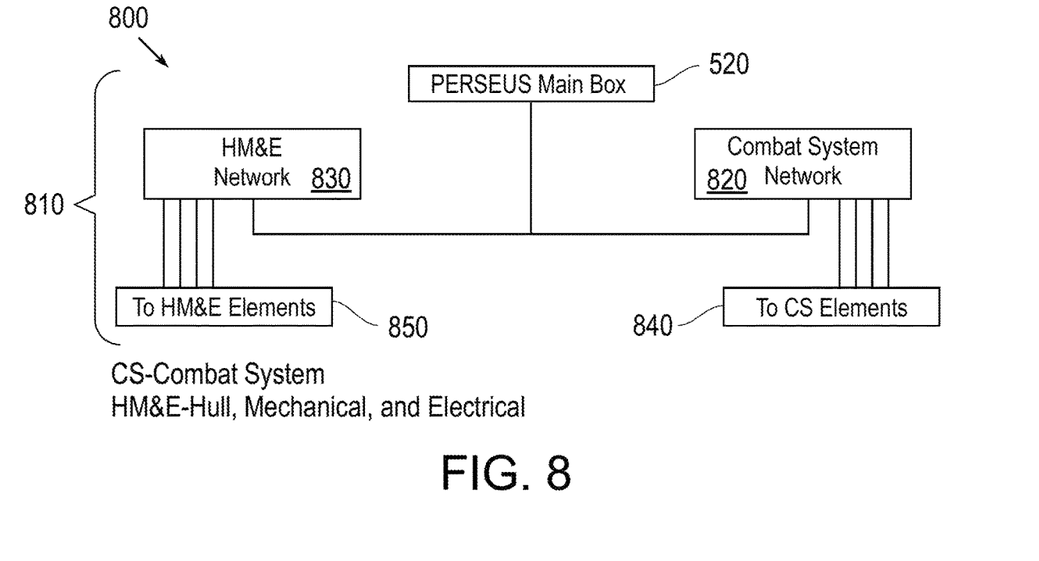
FIG. 8 is a schematic view of a connected power network.

FIG. 8 shows a diagram view 800 of an exemplary network 810. In these concepts, the PERSEUS Main Box 520 connects directly to the Combat System (CS) 820 and HM&E networks 830 to monitor power consumption. The CS network 820 delivers power to CS elements 840. The HM&E network 830 delivers power to the HM&E components 850. The Main Box 520 passively listens for messages that contain reports of state change, which may indicate a shift in power consumption or generation, or else for power usage reports.

Advantages of the network 810 include direct system state observation, absence of external hardware, and minimal connection points. Disadvantages of the network 810 include requirement of external systems to report power usage, dependence on external (non-compatible) message formats, and linking of unclassified and classified networks together (constituting a security risk).

Figure 9:
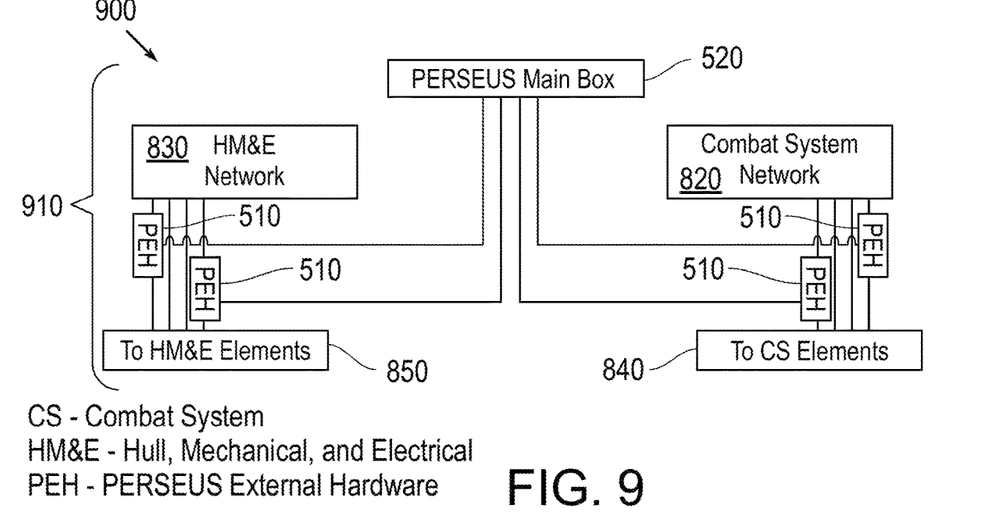
FIG. 9 is a schematic view of an observation power network.

FIG. 9 shows a diagram view 900 of an exemplary network 910. For network 910, additional PERSEUS external hardware (PEH) components 510 are interposed between the networks 820 and 830 and their respective elements 840 and 850. Advantages to the network 910 include direct system state observation and minimal connection points. Disadvantages to the network 910 include need for external systems to report power usage.

Figure 10:
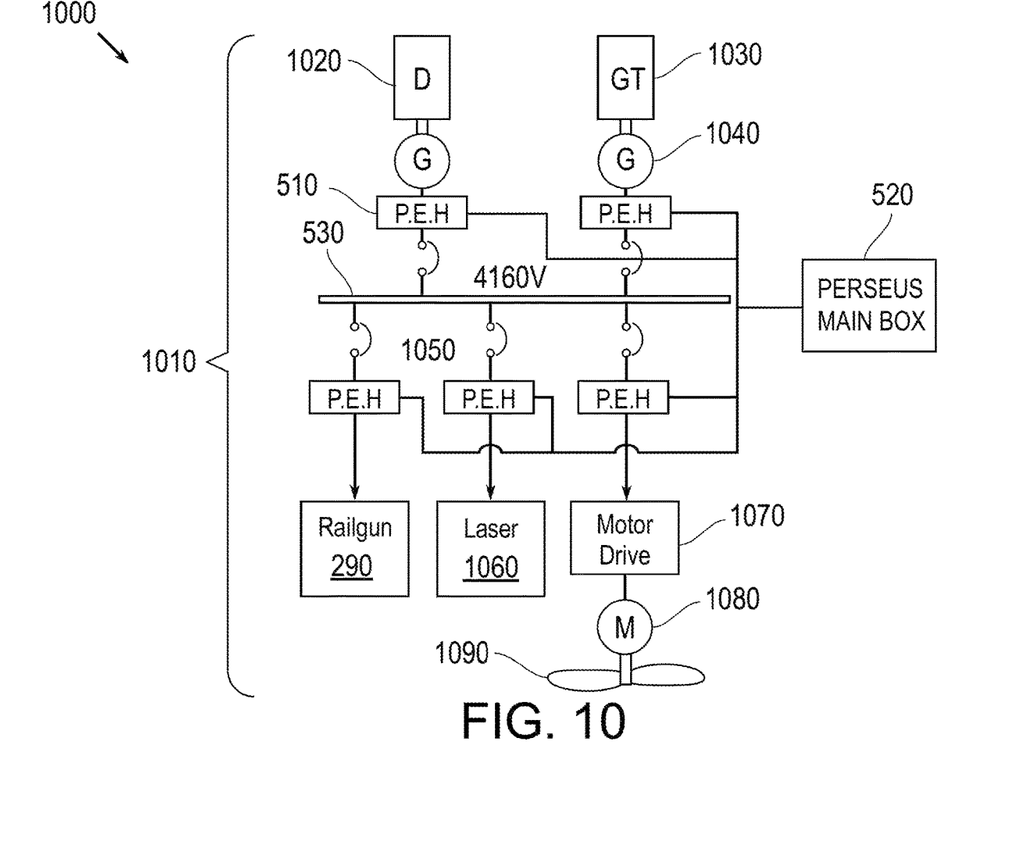
FIG. 10 is a schematic view of a sensor network.

FIG. 10 shows a diagram view 1000 of Propulsion Selection Concept as diagram 1010. Motive torque providers, such as a diesel engine 1020 and a gas turbine 1030 each connect to a generator 1040 to feed power to a bus 530 at 4.16 kV via a switch 1050. Power from the bus 530 can be delivered to components such as a railgun 290 and a laser 1060. A further motor drive 1070 that turns a motor 1080 to spin a propeller 1090 also receives power from the bus 530. Each of these components can be equipped with a PEH 510 and connect to the bus 530 interposed by the switch 1050. Advantages include high fidelity and independence of external message formats. Disadvantages include limited scalability and only indirect monitoring of state changes.

Figure 11:
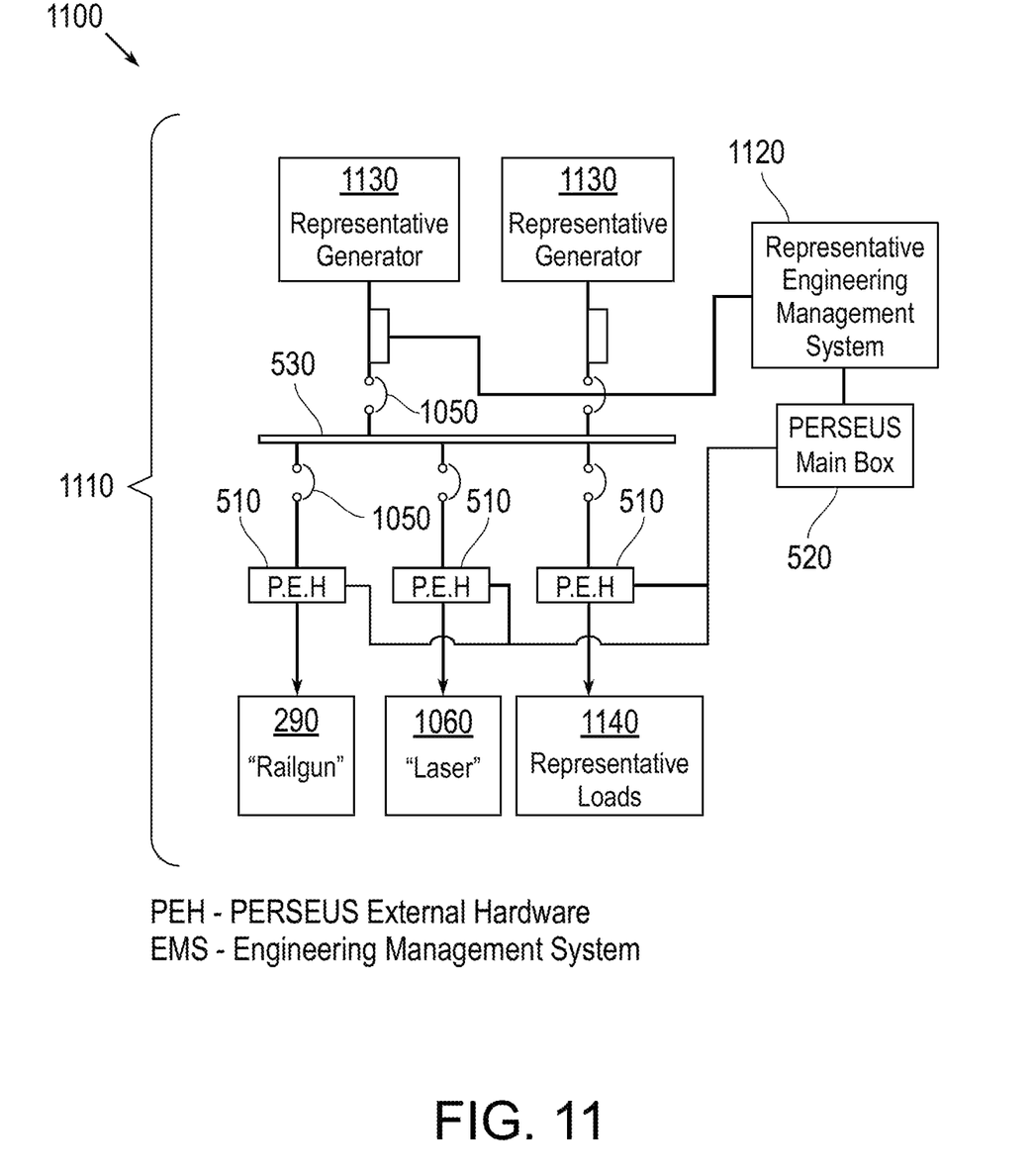
FIG. 11 is a diagram view of a power management system.

FIG. 11 shows a diagram view 1100 of In-line Message Observations Concept as diagram 1110. A representative engineering management system 1120 interfaces the PERSEUS Main Box 520 and a series of representative generators 1130, each connected by a corresponding switch 1150. These components feed into a bus 530. The Main Box 520 connects to PEH components 510, each connected to the bus 530 via a switch 1050. Each PEH component 510 connects to a separate element, such as railgun 290, laser 1060 and other representative loads 1140.

This concept network 1110 is very similar to networks 810 and 910. However rather than connecting to the CS 820 and HM&E 830 networks directly as in network 810, PERSEUS 130 uses PEH 510 to observe message traffic from only specific elements. In this concept, PEH 510 serves as a "promiscuous-mode" packet sniffer, opening messages, reading the desired power consumption data. The advantage includes direct system state observation more localized than high-level network connection. The disadvantages include potential errors introduced with in-line message observation, dependence on separate message formats, and limited scalability.

Figure 12:
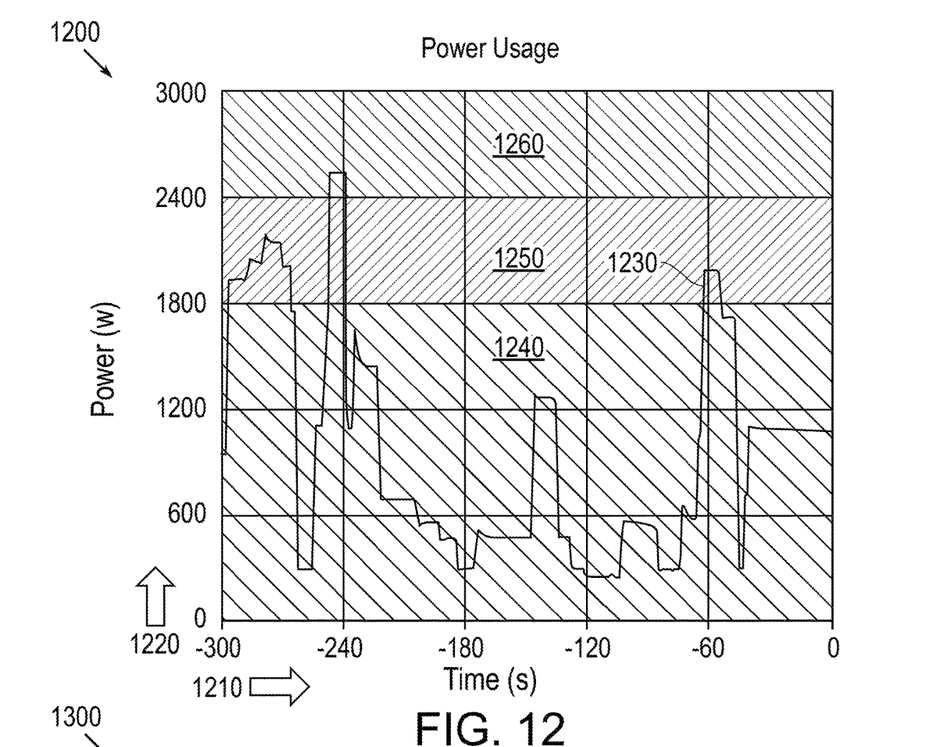
FIG. 12 is a graphical view of power usage with time.

Monitoring of power can be accomplished graphically. For example, FIG. 12 shows a graphical view 1200 of total power consumption over time as a line plot. Time 1210 (s) denotes the abscissa, while power 1220 (W) represents the ordinate. A transient track 1230 denotes total power level. The plot in view 1200 is divided into a safe zone 1240 (below 1.8 kW), a caution zone 1250 (between 1.8 kW and 2.4 kW) and a hazard zone 1260 (between 2.4 kW and 3.0 kW). Most of the track 1230 indicating power remains in the safe zone 1240, with the primary exception of the interval between −230 s and −240 s.

Figure 13:
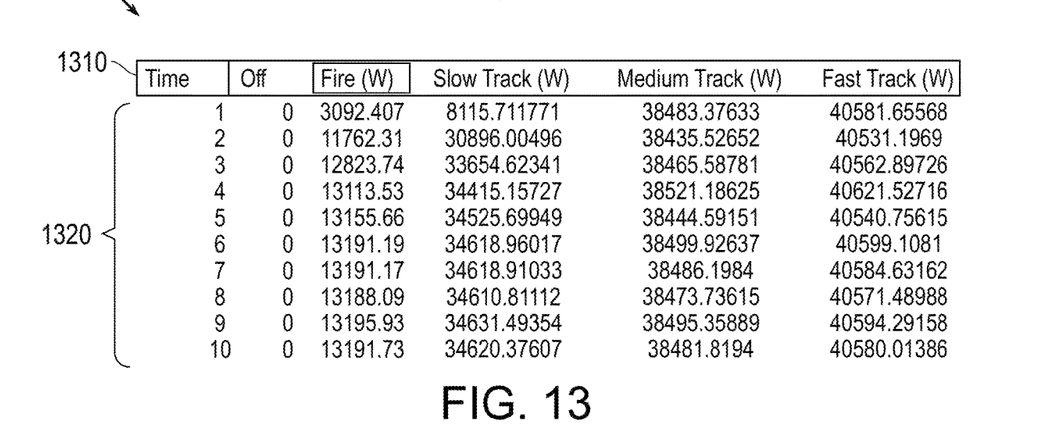
FIG. 13 is a tabular view of a power lookup table.
Figure 14:
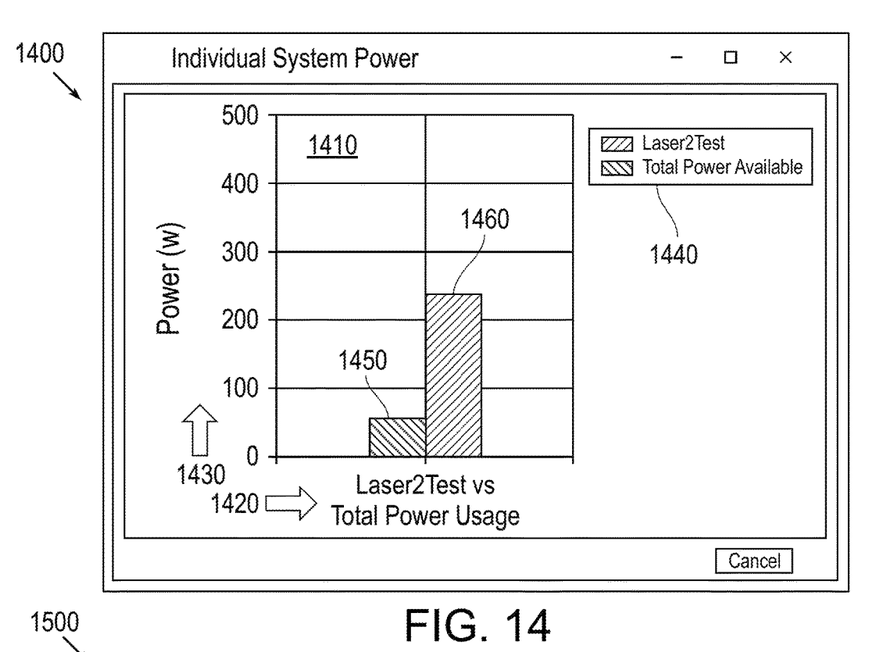
FIG. 14 is a graphical view comparing component usage available.

PERSEUS 130 projects hypothetical power consumption using Power Lookup Tables 680. The SFM 26 team constructed these tables based on data from subject-matter experts and the results of PEGASUS simulations. FIG. 13 shows a tabular view 1300 of profile needs profile 310 as an example Power Lookup Table 680. A header 1310 identifies the columns for the tabular data 1320. The header 1310 in this example compares several tracks by speed for power. The data feature only minor temporal variation with a few exceptions. At a typical time of five, fire is 13.1 kW, slow track is 34.5 kW, medium track is 38.4 kW and fast track is 40.5 kW, showing modest increase in power drawn with speed. Additionally, FIG. 14 shows a graphical view 1400 comparing individual system power usage as a bar chart 1410. Ship components 1420 provide the abscissa, while power 1430 (W) denotes the ordinate. A legend 1440 identifies the components for power: laser level 1450 of about 0.07 kW and available 1460 as 0.23 kW. This conveniently illustrates the usage between systems and the amount available.

Figure 15:
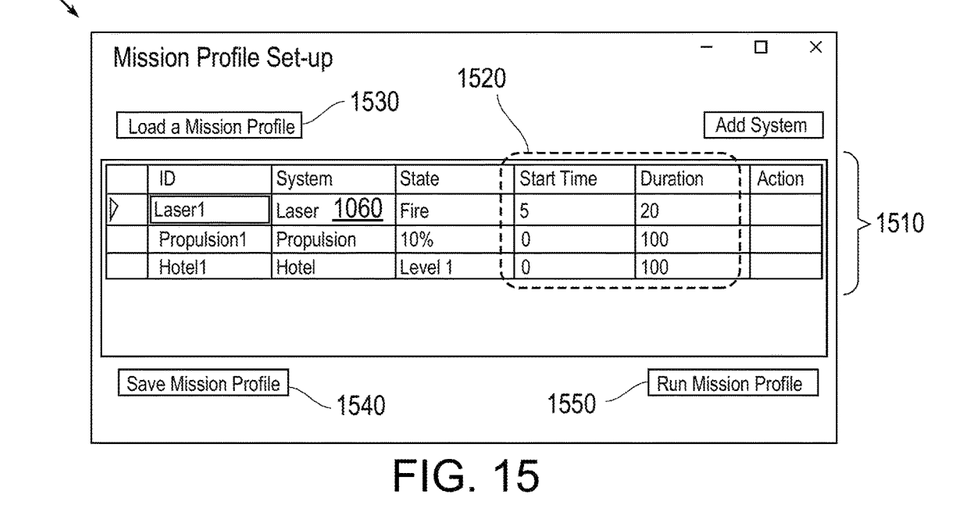
FIG. 15 is a tabular view of state conditions for components.
Figure 16:
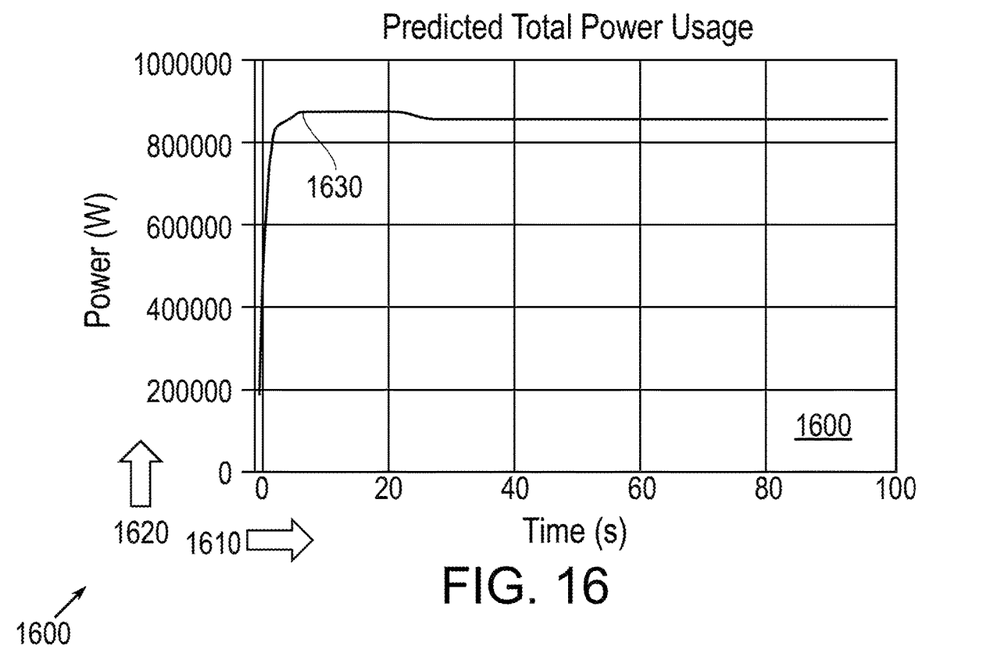
FIG. 16 is a graphical view of a component power usage.

FIG. 15 features a tabular view 1500 of a graphic 1510 of a mission profile 150 including a column listing identified elements, such as laser 1060, as well as operational conditions. An envelope 1520 highlights start time and duration. Selection buttons include profile loading 1530, recording 1540 and execution 1550. FIG. 16 features a graphical view 1600 of a plot for a mission profile 150. Time 1610 (s) denotes the abscissa, while power 1620 (W) represents the ordinate. The power consumption line 1630 corresponds to the time and duration of the envelope 1520. After initiation, power remains at 835 W except for the 20 s interval in which the laser 1060 operates pushing the maximum power to 850 W.

Figure 17:
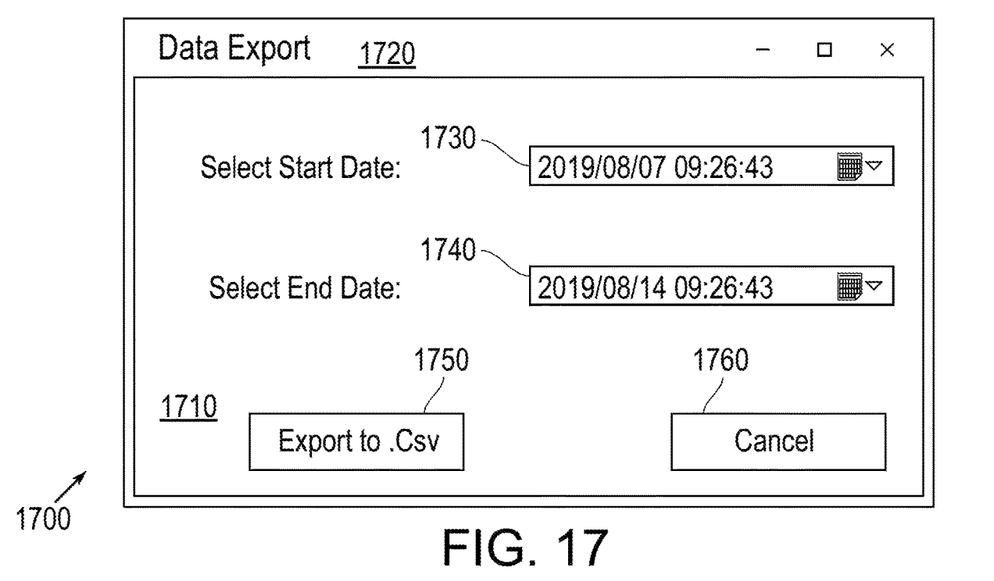
FIG. 17 is a graphical user interface view of data selection.

The example values used in the Power Lookup Tables 680 can be leveraged to create profiles of needed power for operationally provided missions that depict different power usage scenarios, such as shown in plot view 1600. The power needs profiles 310 created thereby demonstrate the expected power usage 340 for the associated mission profile 150 in a battle scenario. PERSEUS 130 records power consumption data and provides the operator 610 with the ability to export these data for later application as a '.csv' file. This file can then be used for potential data analysis on or off the ship. FIG. 17 features a screen view 1700 (e.g., GUI 630) of an example .csv export as a GUI window 1710 for under a data export menu 1720. Dialog boxes 1730 and 1740 respectively feature start and end dates based on look up tables 680 for the interval of interest. Selection buttons enable file export 1750 and cancel 1760.

Figure 18A:
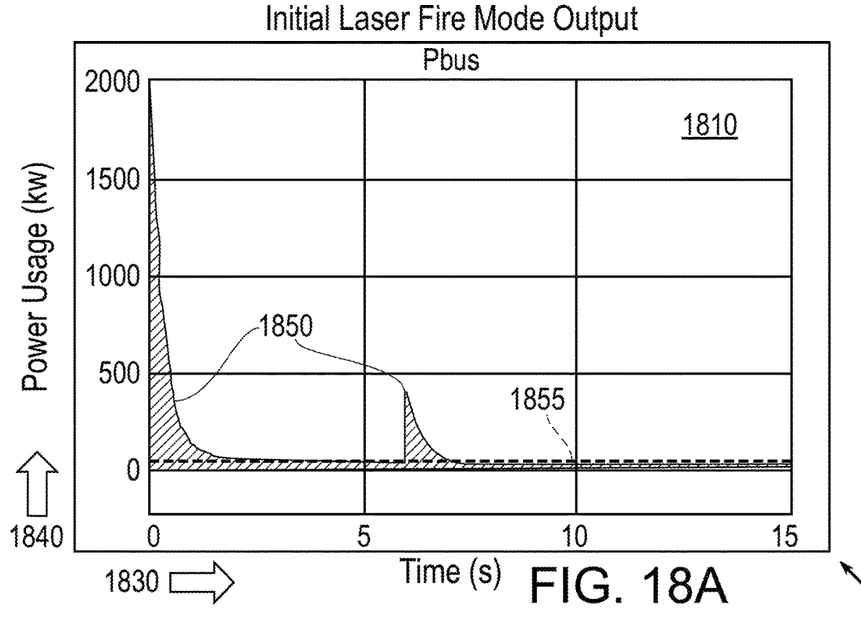
FIGS. 18A and 18B are graphical views of laser fire power usage.
Figure 18B:
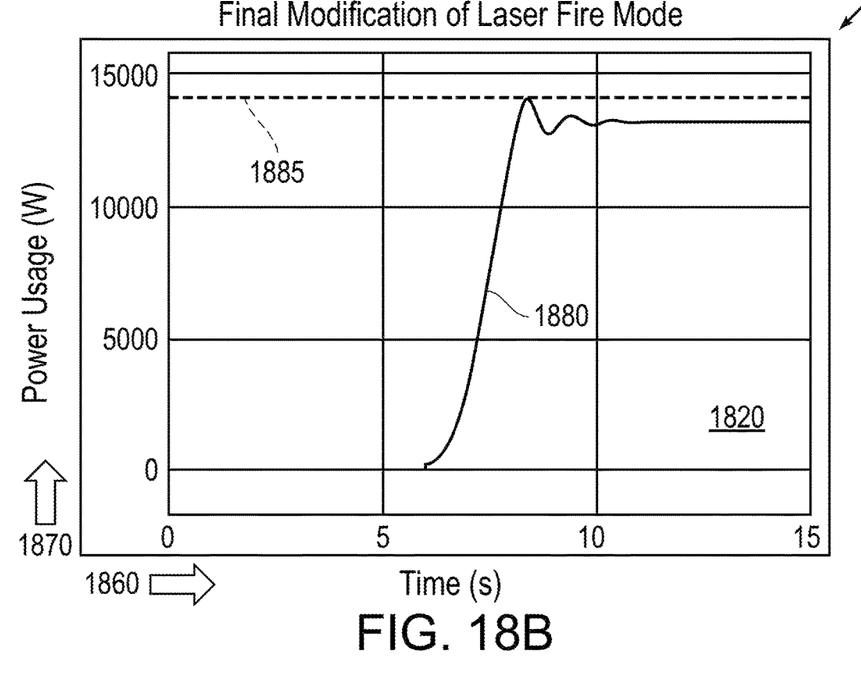

The PERSEUS team improved the fidelity of existing PEGASUS modules shown by comparison. FIGS. 18A and 18B feature graphical views 1800 of an initial PEGASUS module output plot 1810 and PEGASUS module output after PERSEUS improvement plot 1820. For output plot 1810 for initial laser fire mode output, time 1830 (s) denotes the abscissa, while power usage 1840 (kW) denotes the ordinate. Power level 1850 asymptotically decreases after initial spikes. A dash line 1855 represents a threshold. For final modification plot 1820 of laser fire mode in detail, time 1860 (s) is the abscissa, while power usage 1870 (W) presents the ordinate. A power line 1880 shows a ramp up in power with damped oscillation leveling to 13 kW, and dash line 1885 represents a threshold at 14 kW.

In graph 1810 of FIG. 18A, a huge initial spike rises above 1.5 MW and the expected ~14 kW of a laser fire is marked by the dash line. Plot 1820 in FIG. 18B illustrates the final modification results to the modules. The final module strikes very close to the expected ~14 kW output that shows merely one of the drastic fidelity improvements made to the Simulink modules.

The overall PERSEUS 130 design offers great scalability and external system independence. A naval operator 610 can add or remove sensors from a PERSEUS installation, enabling the operator 610 to monitor as many or as few systems as desired, while maintaining the data collected for the removed sensors if needed. The modularity of PERSEUS 130 enables the operator to switch (or swap out) any of the sensors for a different type of current sensor. This facilitates ability to replace broken sensors, upgrade sensors, and select a sensor that most appropriate for the system in question.

Because PERSEUS 130 does not "listen" to message traffic or otherwise communicate with the systems under observation, PERSEUS 130 is not affected by changes to these systems' communication protocols and offers a non-cross-domain solution. PERSEUS 130 is not integrated into the design of a ship and can be retrofitted onto existing systems. Expansion of this capability to automated control entails feedback to affect power to select systems based on mission priority and related protocols.

When comparing PERSEUS 130 to existing systems, there are three to examine: the MCS, PINCER, and PEGASUS 140. The MCS is already implemented on ships but only monitors the HM&E systems 126 and risks a cross-domain issue if expanded to weapon systems. PINCER looks to create a fictional interface where the weapon systems and the MCS can communicate. The issue with creating this conventional interface its introduction of a cross-domain issue due to communication between classified and unclassified systems and this fictional interface would have to be implemented on both the MCS and all new and pre-existing weapon systems.

This would require a huge effort to implement across the Navy and cause potential security risks. The PEGASUS effort only focuses on the output of models based on weapon systems with no physical systems involved that creates an "ideal" environment for the model predicting electrical usage. PERSEUS 130 offers the potential for power monitoring of both HM&E and weapon systems with a platform that can be easily retrofitted on existing and new systems with little to no changes to the systems themselves. PERSEUS 130 also incorporates the PEGASUS models to view both the actual and predictive power usage of scenarios and enables the predictive power usage numbers to be readily updated in the future as the models improve.

NSWCPD develops systems generically known as Engineering Management Systems (EMS) for monitoring a ship's electrical buses 530 at a high-level. In this concept, PERSEUS 130 does not directly monitor HM&E devices, but instead interfaces with the engineering management system that communicates with individual HM&E systems. Advantages include leveraging conventional HM&E monitoring and improved scalability. Disadvantages include lack of control over HM&E fidelity absent interface development.

The SFM 26 team designed PERSEUS 130 to monitor electrical consumption on Navy ships, but the design is sufficiently agnostic to monitor any platform where power generation is limited and power consumption is distributed to multiple, dynamic loads. PERSEUS 130 is applicable to any vessel, Navy or commercial. PERSEUS 130 could extend to Navy shore-based test sites. Although the consumer market for residential and industrial "smart-meter" products already exists, PERSEUS 130 could be marketed for monitoring commercial and industrial land-based power plants, grids, and buildings.

For example, Lucy (from the cartoon strip "Peanuts") owns a lemonade stand with a blender and radio that are both connected to a generator for power. (The blender aids in producing lemonade, while the radio attracts customers.) Lucy wants to use PERSEUS 130 to monitor the power consumption of her business. Lucy takes off a portion of the insulation covering to the wires of the blender and radio power cords and places an electrical current sensor around one of the wires of each power cable.

Following the PERSEUS user manual, Lucy then properly connects her sensors and configures the power meter. Once established, she opens the PERSEUS application and adds the rated power of her generator. After the generator maximum power output is established, Lucy can observe the power usage of both her blender and radio, updating every second. Lucy can also view the power usage of only the radio and compare how much power being used compared to total power consumption.

Lucy notices that when her blender is on "high" speed, radio reception degrades (with increasing static). Lucy views her total power usage track 1230 on the PERSEUS main screen and observes that she is in the hazard zone 1260 for power consumption (>80% of available power). This description involving view 1200 is merely descriptive and not necessarily representative of the interval between −230 s and −240 s along the time 1210 abscissa. Because of this, Lucy wants an estimate of when she can run the blender at different speeds without affecting the radio.

This version of PERSEUS 130 has a power look-up table 680 in view 1300 for both a radio and a blender. Lucy creates different scenarios, called mission profiles 150. These scenarios involve her blender operating at different speeds with the radio being on/off, and then views her projected power usage 340, as in power needs profile 310 for each scenario. Lucy now sees that she is unable to have the radio on while the blender is on its medium and high speeds due to the projected power usage 340 being greater than what her generator can produce. Based on this prediction, Lucy begins to shop for a more powerful generator.

In order to find out what generator 1040 she will need, Lucy decides to export 650 the data she has been recording. Lucy multiplies the electrical current value column in the exported data by 120 V to estimate how much power her lemonade stand uses. After reviewing the data, Lucy concludes that she needs at least another 200 W in order to operate her lemonade stand smoothly. She also reviewed the power consumption specifications for her radio online and noted that it uses more power than expected. Thus, the PERSEUS data suggest that the radio suffer interference when the blender operates at its medium and high speeds due to the predicted power usage being greater than what her generator 1040 can produce. Based on this prediction, Lucy begins to shop for a more powerful generator.

This type of PERSEUS-style monitoring demonstrates practical benefits in optimizing operational power usage. PERSEUS 130 stores power generation and consumption data in recorder 160 collected from elements of the HM&E 850 and Combat System 840. Operators 610 access this data repository as in memory 740 in conjunction with simulation information from PEGASUS 140. In particular, PERSEUS 130 integrates mission profile 150 that schedules operation of select electrical components for combat 840 and ship functions 850 with PEH monitors 510 on those components against State Determination Logic 620 and Power Lookup Tables 680 in PERSEUS 140. Under hypothetical automation (presently unauthorized), the feedback monitoring could be employed to directly and automatically control power levels for select components based on mission parameters and priority parameters.

PERSEUS 130 expands on the PEGASUS model, which is comprised of an Energy Analysis Block, HM&E Modules, and Combat System Modules. PERSEUS 130 retains the ability from PEGASUS 140 to use a mission profile 150 and output power profiles 190. PERSEUS 130 adds the ability to observe a physical platform of systems as with system hardware 120. PERSEUS 130 collects electrical generation and consumption data from the platform under observation. This live input is recorded 160 and fed to the module update algorithm 180 to validate and update the output of the PEGASUS simulations closer to the platform under observation.

Navy ships have a variety of electrical loads, all requiring large amounts of power on inconsistent schedules. PERSEUS provides decision makers onboard the ship with the ability to observe power available as a "current inventory" while in a tactical scenario. Onboard decision makers can also employ PERSEUS 130 when preparing for an engagement or mission to view and analyze the projected power needs required in order to complete their mission. Although not presently implemented, such interaction can be used to control power levels for selected components in an automated mode.

While certain features of the embodiments of the invention have been illustrated as described herein, many modifications, substitutions, changes and equivalents will now occur to those skilled in the art. It is, therefore, to be understood that the appended claims are intended to cover all such modifications and changes as fall within the true spirit of the embodiments.

What is claimed is:

1. A computer implemented method for monitoring and managing available electrical power for a system, said method comprising:
   establishing a threshold for the available electrical power;
   sensing measurable electrical usage for a component in a state condition;
   combining said measurable electrical usage with the available electrical power;
   comparing said measurable electrical usage for said component in said condition to a power lookup table; and
   adjusting said measurable electrical usage so the available electrical power remains below said threshold.

2. The method according to claim 1, wherein monitoring devices provide said measurable electrical usage on an intermittent basis.

3. The method according to claim 1, wherein said state condition is determined by a mission profile for schedulable operation of said component.

4. The method according to claim 1, wherein a graphical user interface displays said measurable electric usage.

5. The method according to claim 1, wherein said measurable electric usage is determined by a voltmeter.

* * * * *